(12) United States Patent
Manweiler et al.

(10) Patent No.: US 6,208,522 B1
(45) Date of Patent: Mar. 27, 2001

(54) COMPUTER CHASSIS ASSEMBLY WITH A SINGLE CENTER PLUGGABLE MIDPLANE BOARD

(75) Inventors: Kurt A. Manweiler, Tomball; Thomas T. Hardt, Missouri City; Michael C. Sanders, Spring, all of TX (US)

(73) Assignee: Compaq Computer Corp., Houston, TX (US)

( * ) Notice: Subject to any disclaimer, the term of this patent is extended or adjusted under 35 U.S.C. 154(b) by 0 days.

(21) Appl. No.: 09/249,506

(22) Filed: Feb. 12, 1999

(51) Int. Cl.[7] ....................................................... H05H 7/20
(52) U.S. Cl. ........................... 361/752; 361/796; 361/727
(58) Field of Search ............................. 361/752, 725–727, 361/736, 796, 683–686

(56) References Cited

U.S. PATENT DOCUMENTS

| | | | |
|---|---|---|---|
| 5,027,254 | * 6/1991 | Corfits et al. | 361/384 |
| 5,031,070 | * 7/1991 | Hsu | 361/380 |
| 5,297,000 | * 3/1994 | Freige et al. | 361/692 |
| 5,808,876 | * 9/1998 | Mullenbach et al. | 361/788 |

* cited by examiner

Primary Examiner—Leo P. Picard
Assistant Examiner—Hung Van Duong

(57) ABSTRACT

A modularized computer chassis for housing multiple computer modules, such as a processor module, media storage module, an I/O module, and power supplies includes a housing divided generally into four regions, with each region configured for receiving one of the modules or power supplies. A single center pluggable midplane board is positioned in the middle of the housing such that each of the modules and power supplies can be interconnected through the single midplane board. The single center pluggable midplane board includes direct pluggable connectors which correspond to connectors on each of the modules and power supplies, such that each of the modules and power supplies are directly connected to the single pluggable midplane board, and no ribbon signal and power cables are needed for the connection. The direct connection between the single center pluggable midplane board and the modules and power supplies helps to minimize the height of the chassis, thereby saving valuable rack space.

20 Claims, 12 Drawing Sheets

COMPUTER CHASSIS ASSEMBLY WITH A SINGLE CENTER PLUGGABLE MIDPLANE BOARD

FIELD OF THE INVENTION

The present invention relates to a computer chassis, and more particularly, but not by way of limitation, to a computer chassis constructed to receive multiple modular components and further with a single center pluggable midplane board for cable-less connection of the modular components.

BACKGROUND OF THE INVENTION

Early computer designs generally included a chassis with a plurality of individual components and assemblies mounted therein and connected to one another by means of wires, cables, brackets, nuts, bolts and the like. A major computer design advance occurred with the advent of printed circuit boards, integrated circuits and modular component assemblies. The printed circuit boards were, for example, formed of lightweight material and housed a myriad of components which were electrically interconnected with the component assemblies through wiring harnesses. The wiring harnesses and hard wire connections were subsequently replaced by technologically advanced connectors used for integrally coupling the individual components to each other and to other circuitry in the computer.

In the design of electronic equipment, the use of connectors, modular components, and specialized hardware has permitted key components and printed circuit boards to be efficiently added and removed. Such ease in the addition and deletion of computer components and printed circuit boards has facilitated assembly, repair, upgrade and/or changes in functionality.

Computer reliability and serviceability are also valuable design aspects. Originally, a rule of practice in the maintenance of electrical circuitry, such as computer hardware, was that of always turning the power to the computer off before components or printed circuit boards were added or removed from the computer chassis or support frame. Recent innovations have addressed the desirability to insert and remove modular components and printed cards from electrical equipment, such as computer hardware, when the computer is electrically connected and operational, i.e. "hot." It is now possible for the power to be disconnected from only the connector of the drive or modular component to be removed or inserted while allowing the adjacent components to remain "hot."

Removable computer components today include disc drives, drive cages, fans, power supplies, system I/O modules, processor boards, and other subassemblies. As referenced above, the removability of computer components allows for better overall serviceability of the computer system, which is a distinct advantage to both the user and the maintenance technician. A defective power supply in the main or central computer generally requires prompt replacement in order to limit downtime. It is for this reason that modular components and connectors facilitate prompt replacement and are thus popular in many computer designs.

The modularity of computer systems is thus recognized as an important design consideration. As mentioned above, modules can be removed and examined for operability or other purposes much easier than permanently mounted fixtures within a computer chassis. Because computers provide an integral part of most business operations, it is of utmost importance to maintain the reliability and integrity of the computer system. When the various elements of a computer can be easily removed in a modular form, they can also be replaced to maintain the operational status of the computer.

Many existing design approaches for these types of computer chassis configured to receive modular computer components utilizes ribbon cables to connect interconnect the various modules. This requires the computer chassis to be large enough for a user to be able to reach into the chassis, behind the modules to be able to connect and disconnect the modules. This therefore, requires a larger form factor, thereby taking up valuable rack space.

Therefore, as can be appreciated there is a need for a computer chassis configured to receive modular computer components that can be readily serviced and upgraded, and that also has a minimum form factor.

SUMMARY OF THE INVENTION

The present invention overcomes the above identified problems as well as other shortcomings and deficiencies of existing technologies by providing a computer chassis configured to receive modular components that can be readily serviced and upgraded, and that also has a minimum form factor.

The present invention further provides a modularized computer chassis for housing multiple computer modules, such as a processor module, media storage module, an I/O module, and power supplies. The chassis includes a housing divided generally into four regions, with each region configured for receiving one of the modules or power supplies. A single center pluggable midplane board is positioned in the middle of the housing such that each of the modules and power supplies can be interconnected through the single midplane board. The single center pluggable midplane board includes direct pluggable connectors which correspond to connectors on each of the modules and power supplies, such that each of the modules and power supplies are directly connected to the single pluggable midplane board, and such that no ribbon signal and power cables are needed for the connection. The direct connection between the single center pluggable midplane board and the modules and power supplies helps to minimize the height of the chassis, thereby saving valuable rack space.

BRIEF DESCRIPTION OF THE DRAWINGS

A more complete understanding of the present invention may be had by reference to the following Detailed Description and appended claims when taken in conjunction with the accompanying Drawings wherein:

DETAILED DESCRIPTION

Figure 1:
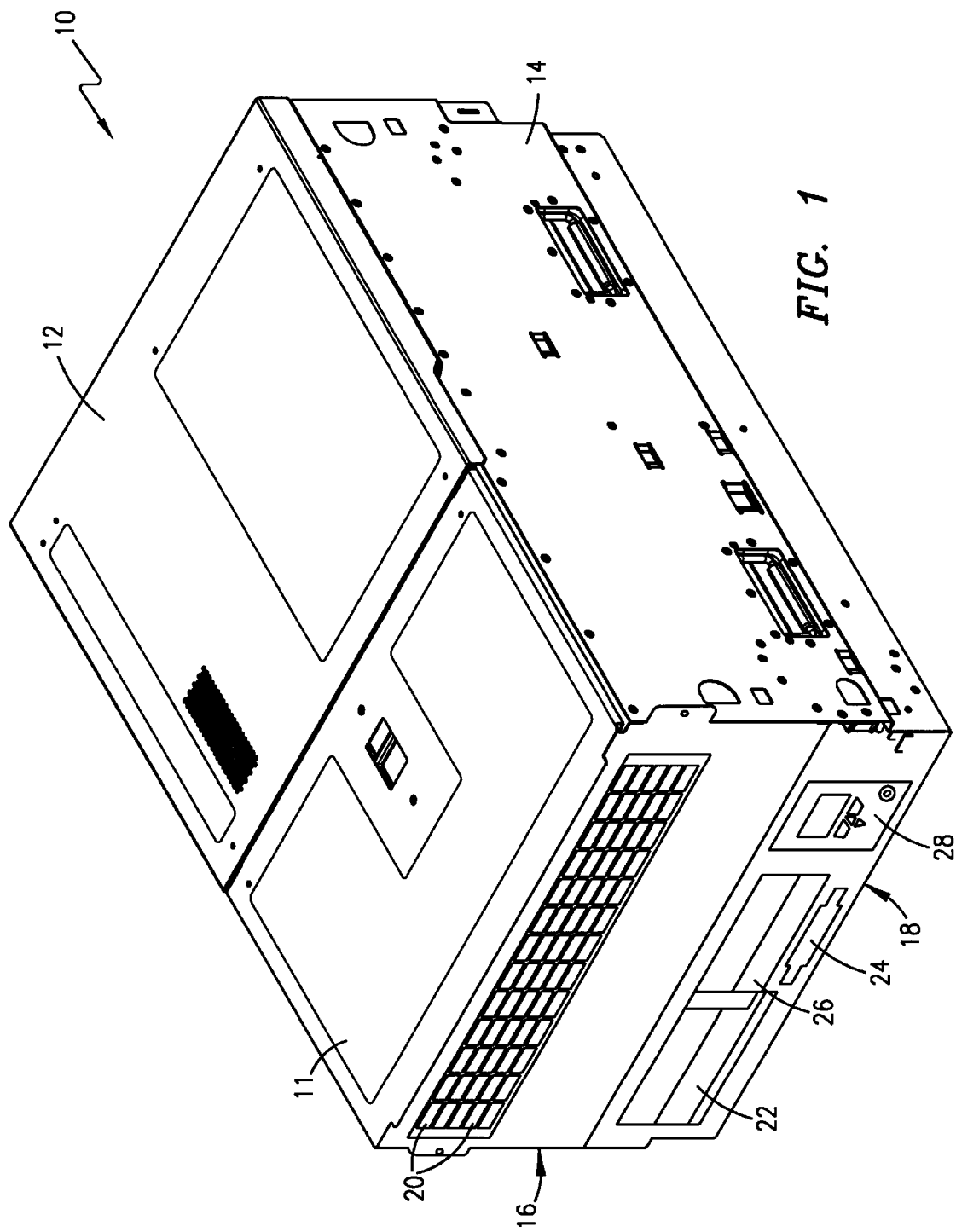
FIG. 1 is a frontal, right side perspective view of a computer chassis constructed in accordance with the principles of the present invention.

Referring now to the drawings wherein like or similar elements are designated with identical reference numerals throughout the several views, and wherein the various elements depicted are not necessarily drawn to scale, and in particular, to FIG. 1, there is shown a front perspective view of a computer chassis 10 constructed in accordance with the principles of the present invention. In an exemplary embodiment of the present invention, computer chassis 10 is configured as a server chassis that is rack mountable. As illustrated, computer chassis 10 includes a fixedly attached top panel 11, and a slidably removable top panel 12, a side panel 14, a removable processor module 16, and a removable media drive module 18. Processor module 16 includes vents 20 for permitting airflow to be drawn over the components therein for cooling purposes.

As further depicted in FIG. 1, media drive module 18 includes media storage devices, such as hard drives 22, floppy drive 24, and CD-ROM drive 26. In this particular embodiment media drive module 18 includes a display unit 28 which is used to monitor and interact with system operations.

Figure 2:
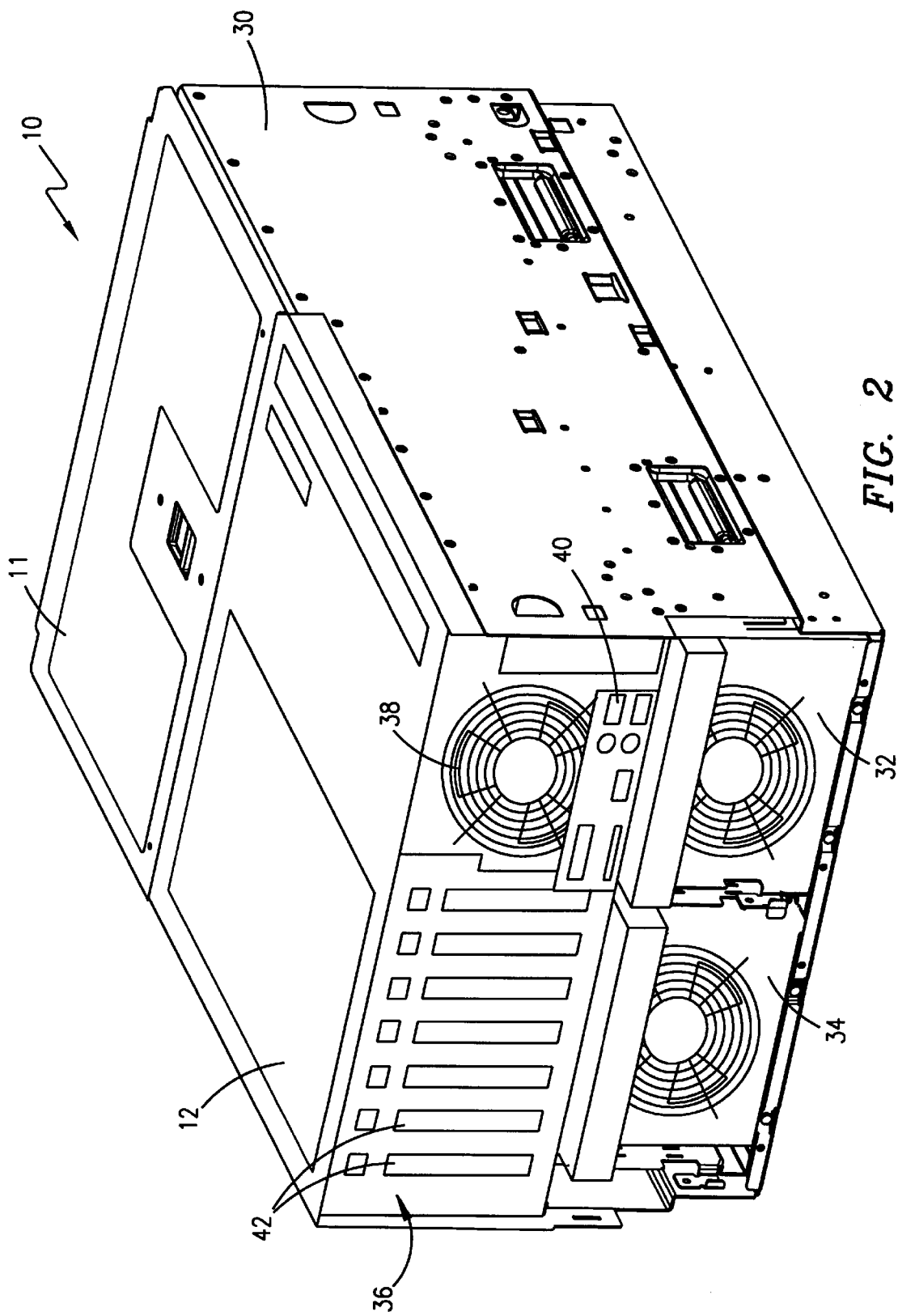
FIG. 2 is a rear left side perspective view of a computer chassis in accordance with the principles of the present invention as similarly shown in FIG. 1.

Referring now to FIG. 2, there is illustrated a rear perspective view of the computer chassis 10. As depicted computer chassis 10 further includes a side panel 30, removable hot-pluggable power supplies 32 and 34, and a removable Input/Output (I/O) module 36. In this exemplary embodiment I/O module 36 includes dual in-line cooling fans, although only cooling fan 38 is identifiable in FIG. 2. I/O module 36 further provides typical I/O functionality such as I/O ports 40, which includes parallel and serial ports and the like. I/O module 36 also includes expansion slots 42 for receiving various computer peripheral components.

Figure 3:
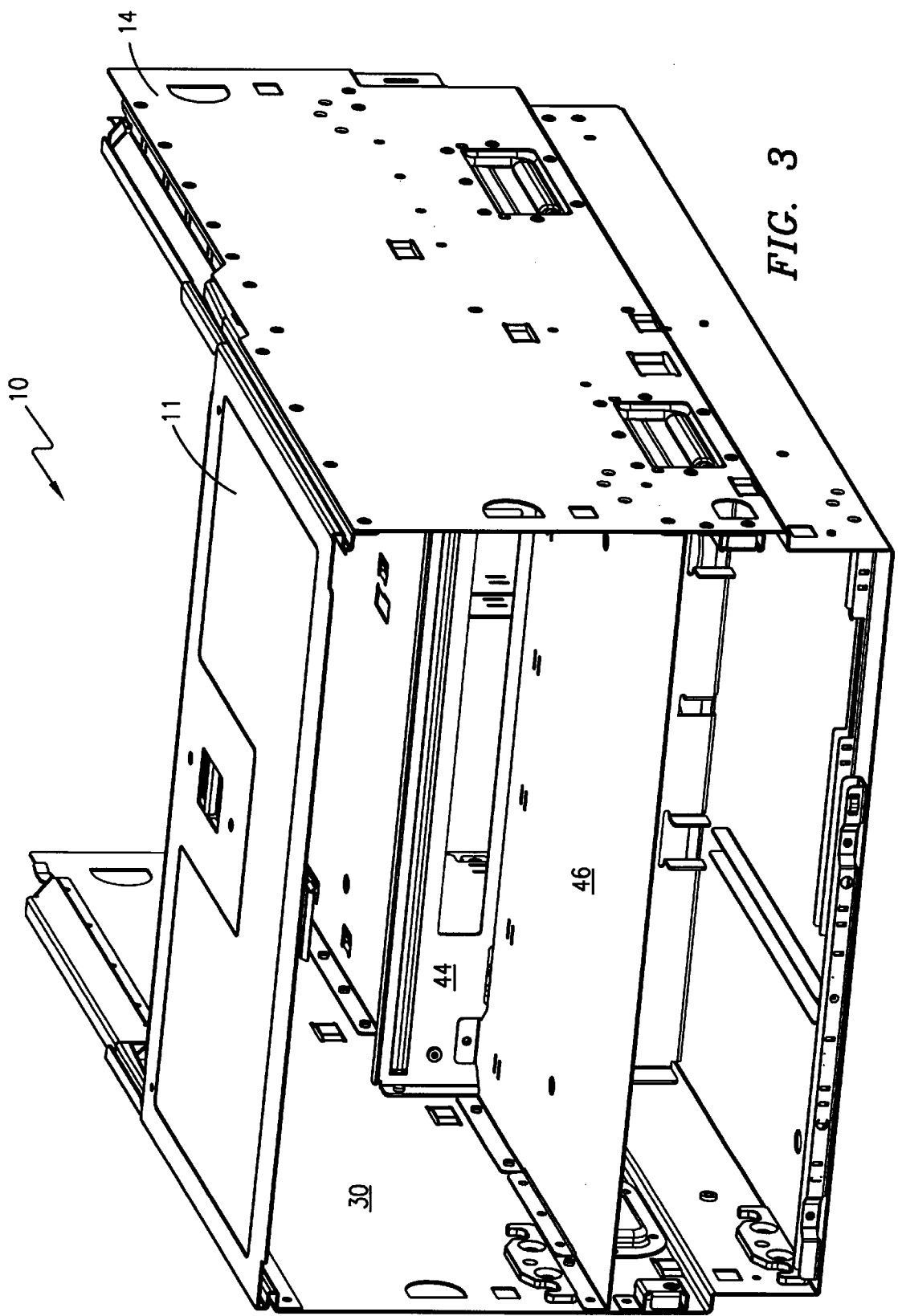
FIG. 3 is a front perspective view of a computer chassis in accordance with the principles of the present invention as similarly shown in FIG. 1 with the modules and top panel removed.

Referring now to FIG. 3, there is illustrated a front perspective view of chassis 10 with each of processor module 16, media drive module 18, I/O module 36 and the power supplies 34 removed therefrom, and the top panel 14 removed from the top of chassis 10. As illustrated, chassis 10 further includes a center support 44 to which the single midplane board (see FIGS. 9–12 described herein below) is secured. The midplane board is utilized to interconnect the various modules and power supplies within the computer chassis 10 without any ribbon signal and power cables. A module divider 46 is secured to side panels 14 and 30 and is used to separate the area of chassis 10 that receives processor module 16 from the area of chassis 10 that receives media drive module 18.

Figure 4:
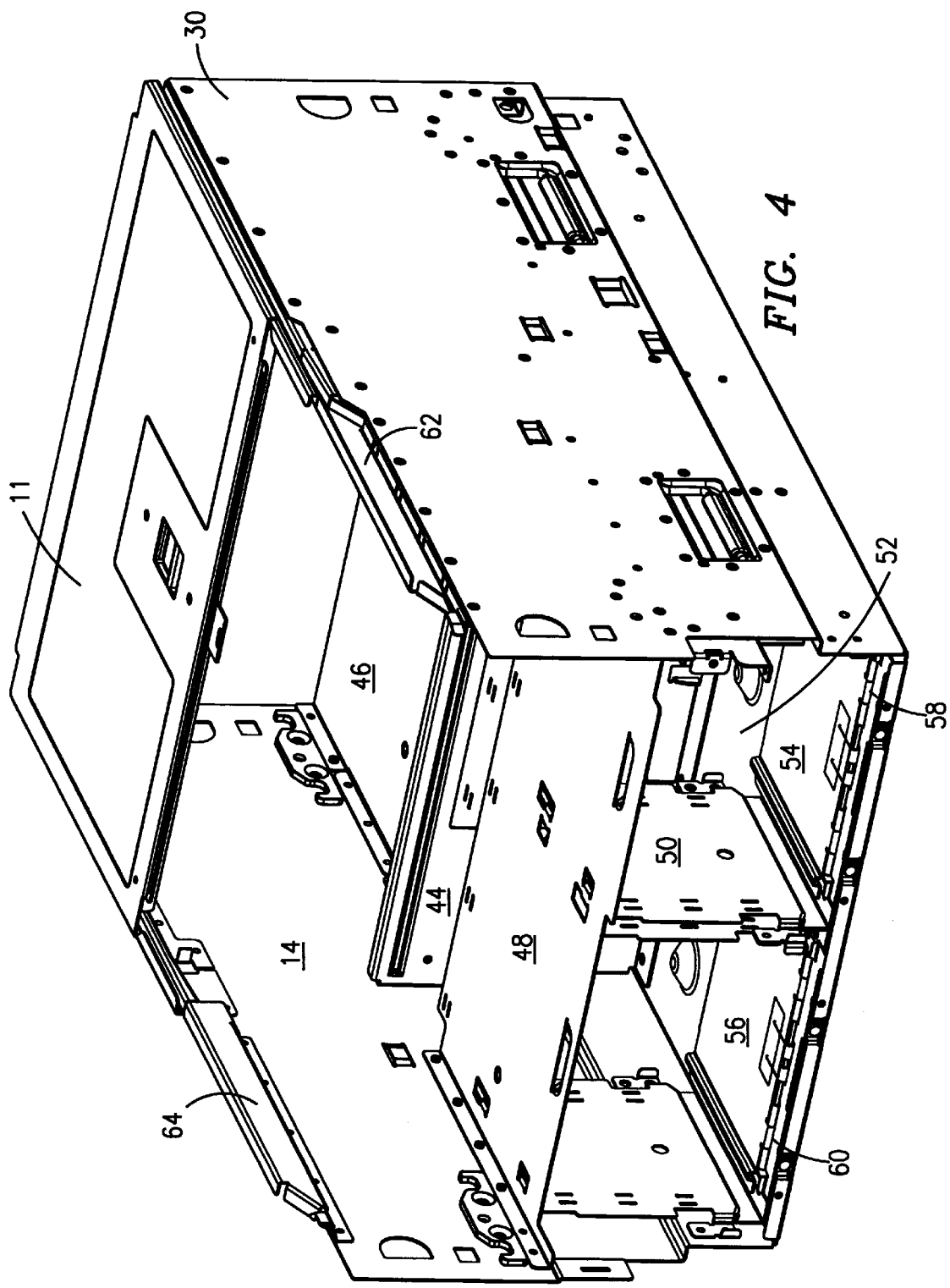
FIG. 4 is a rear, left side perspective view of the computer chassis as similarly shown in FIG. 3.

Referring now to FIG. 4, there is illustrated a rear perspective view of computer chassis 10 with each of the processor module 16, media drive module 18, I/O module 36 and the power supplies 34 removed therefrom, and the top panel 14 removed from the top. A module divider 48 is secured to side panels 14 and 30, and is used to separate the area of chassis 10 that receives the I/O processor module 36 and power supplies 34. A power supply divider 50 is connected to the base 52 of computer chassis and module divider 48, and is used to separate the area of chassis 10 that receives the power supplies 34.

Still referring FIG. 4, two power supply doors 54 and 56 and connected to base 52 of chassis 10 with spring hinges 58 and 60, respectively. Although illustrated in the down or open position for clarity reasons, power supply doors 54 and 56 are normally biased in the closed position when a power supply is not inserted into chassis 10. Among other things, power supply doors 54 and 56, when closed, help prevent improper air flow through chassis 10, thereby improving cooling efficiency of the various modules.

Still referring to FIG. 4, chassis 10 includes tracks 62 and 64, which mate with the edges of top panel 12. Tracks 62 and 64 permit top panel 12 to be slid or moved from above I/O module 36, over fixed top panel 11. This permits quick and easy access to I/O module 36 and it components, as well access to the midplane board.

Figure 5:
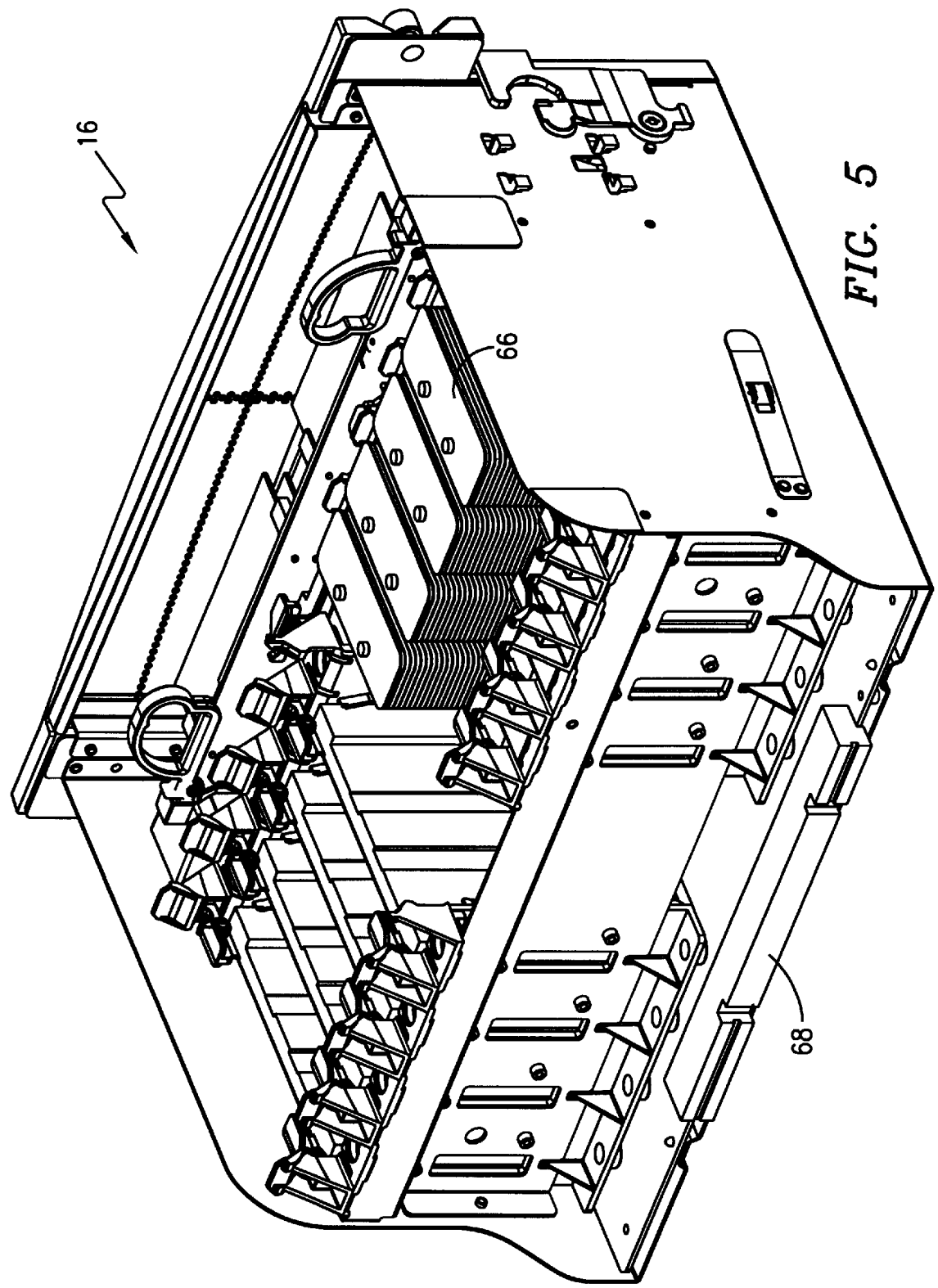
FIG. 5 is a rear perspective view of a processor module in accordance with the principles of the present invention.

Referring now to FIG. 5, there is illustrated a rear perspective view of processor module 16. Processor module 16 has multiple slots to receive multiple processors, such as processor 66 and multiple memory devices. Each of the processors and memory devices of processor module 16 interface with the components of other modules of chassis 10 through processor module connector 68, as well as obtain power from power supplies 34.

Figure 6:
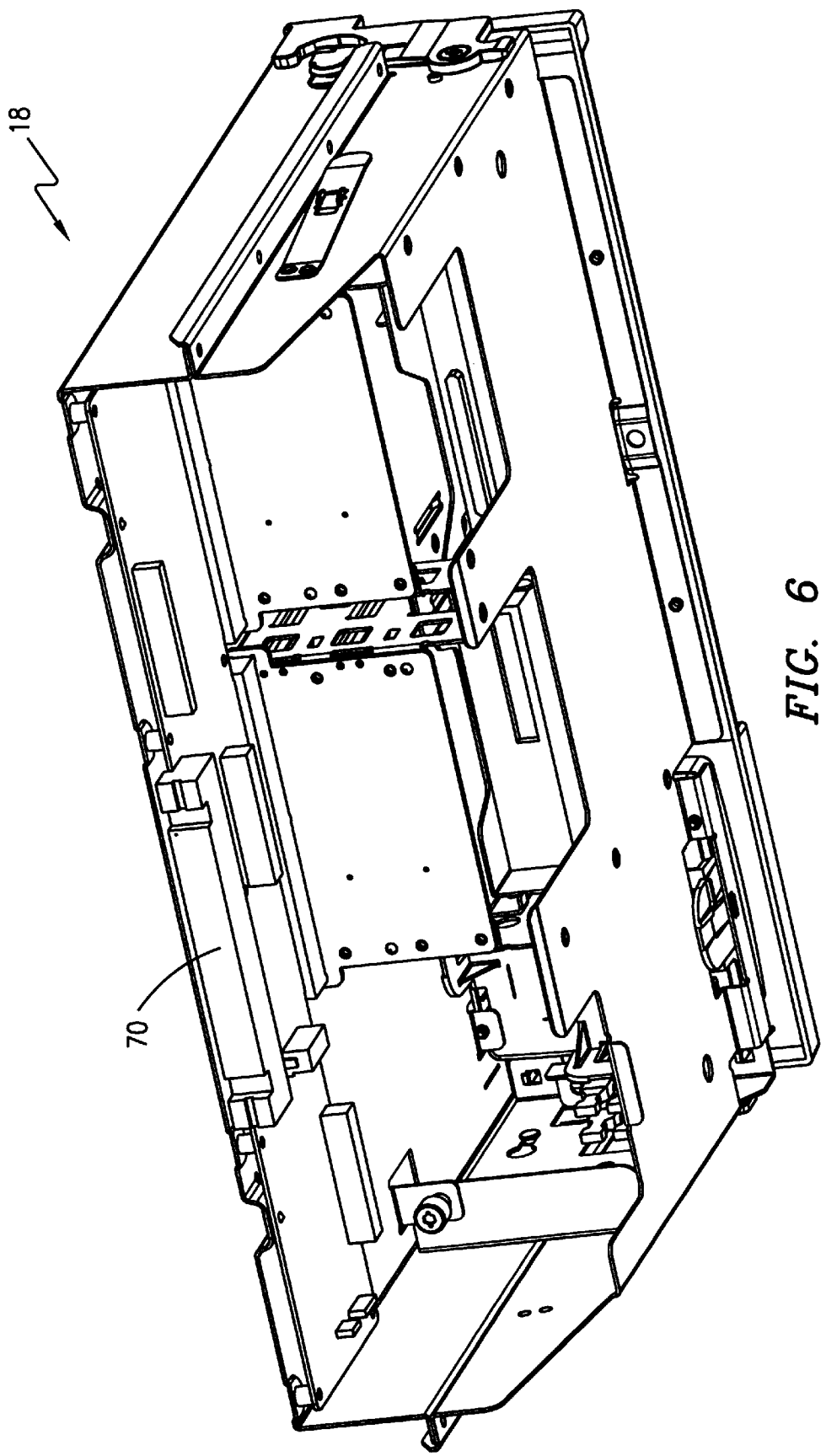
FIG. 6 is a rear perspective view of a media drive module in accordance with the principles of the present invention.

Referring now to FIG. 6, there is illustrated a rear perspective view of media drive module 18. Media drive module 18 includes a media drive module connector 70 which is utilized to interface the components of media drive module 18 with the components of the other modules of chassis 10 as well as to provide power from power supplies 34.

Figure 7:
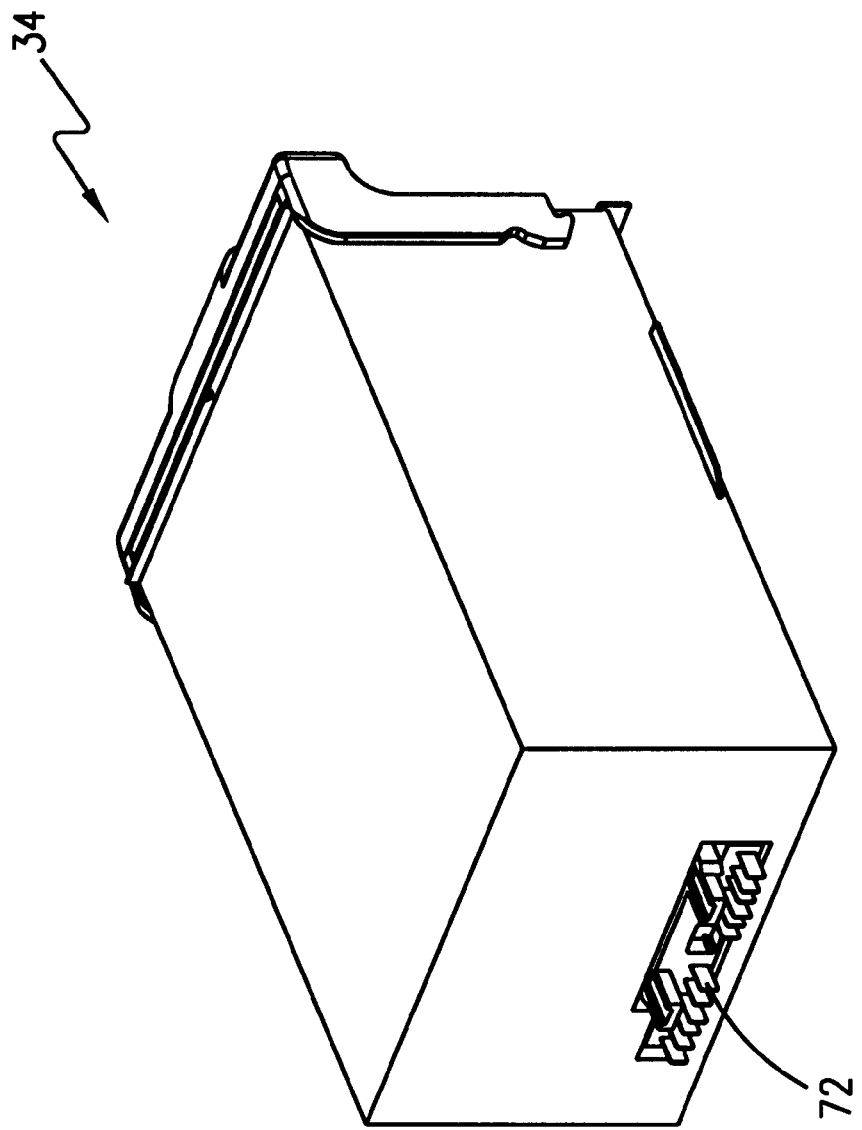
FIG. 7 is a rear perspective view of a power supply in accordance with the principles of the present invention.

Referring now to FIG. 7, there is illustrated a rear perspective view of one of the power supplies 34. Power supply 34 includes a power supply connector 72 which is utilized to interface and supply power to the other components of the other modules of chassis 10.

Figure 8:
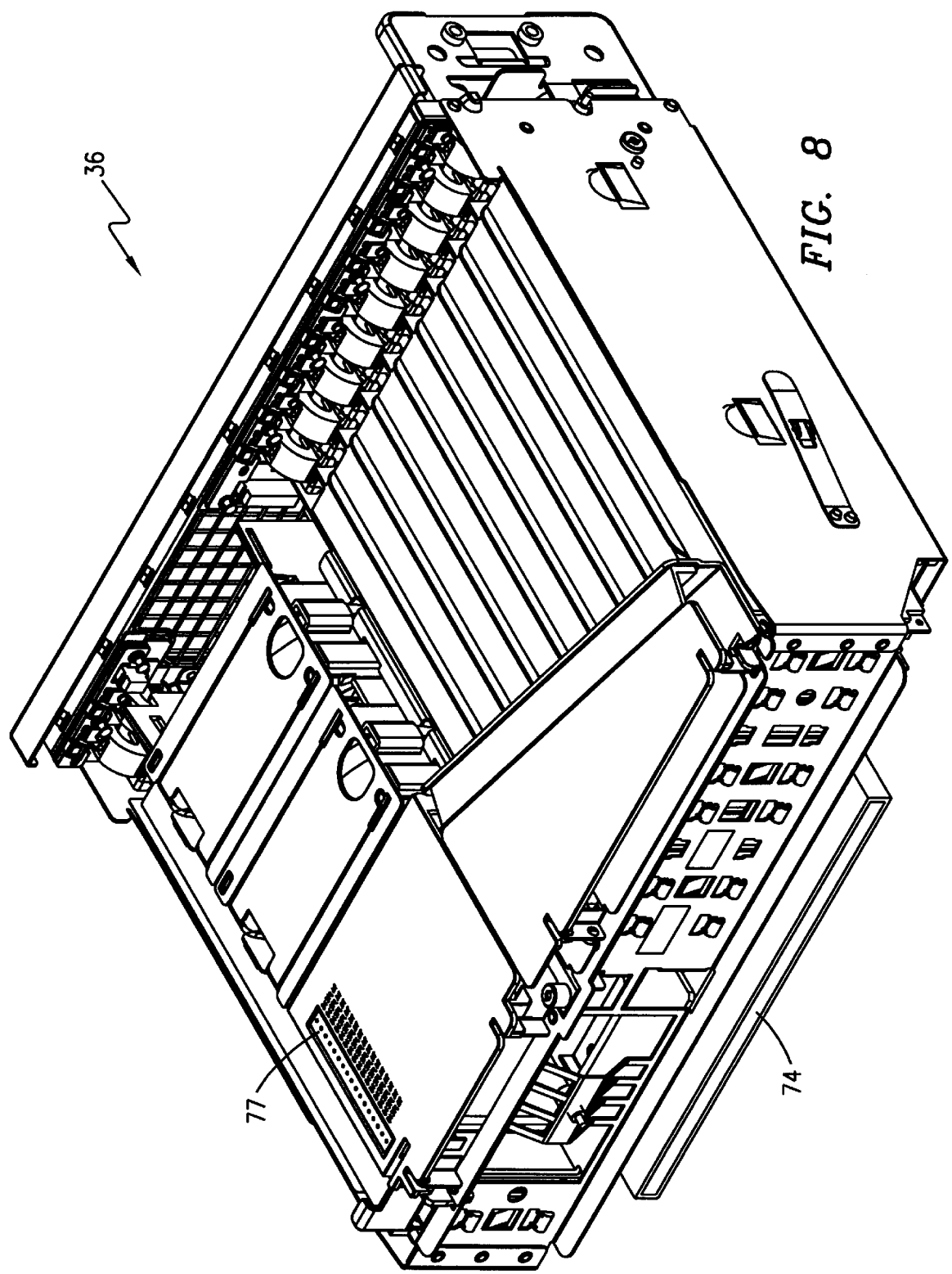
FIG. 8 is a rear perspective view an I/O module in accordance with the principles of the present invention.
Figure 9:
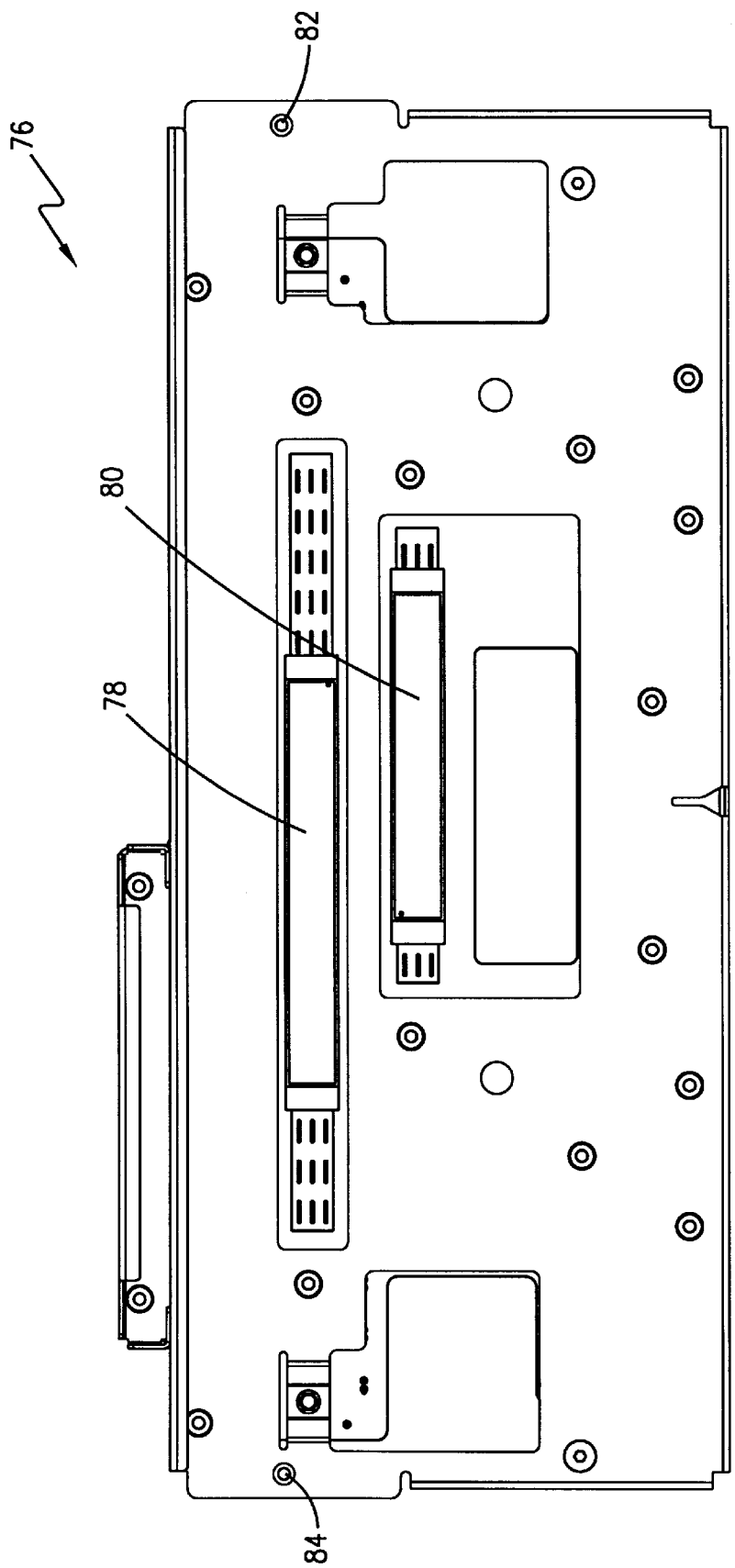
FIG. 9 is a planar front view of a system mid-plane board in accordance with the principles of the present invention.
Figure 10:
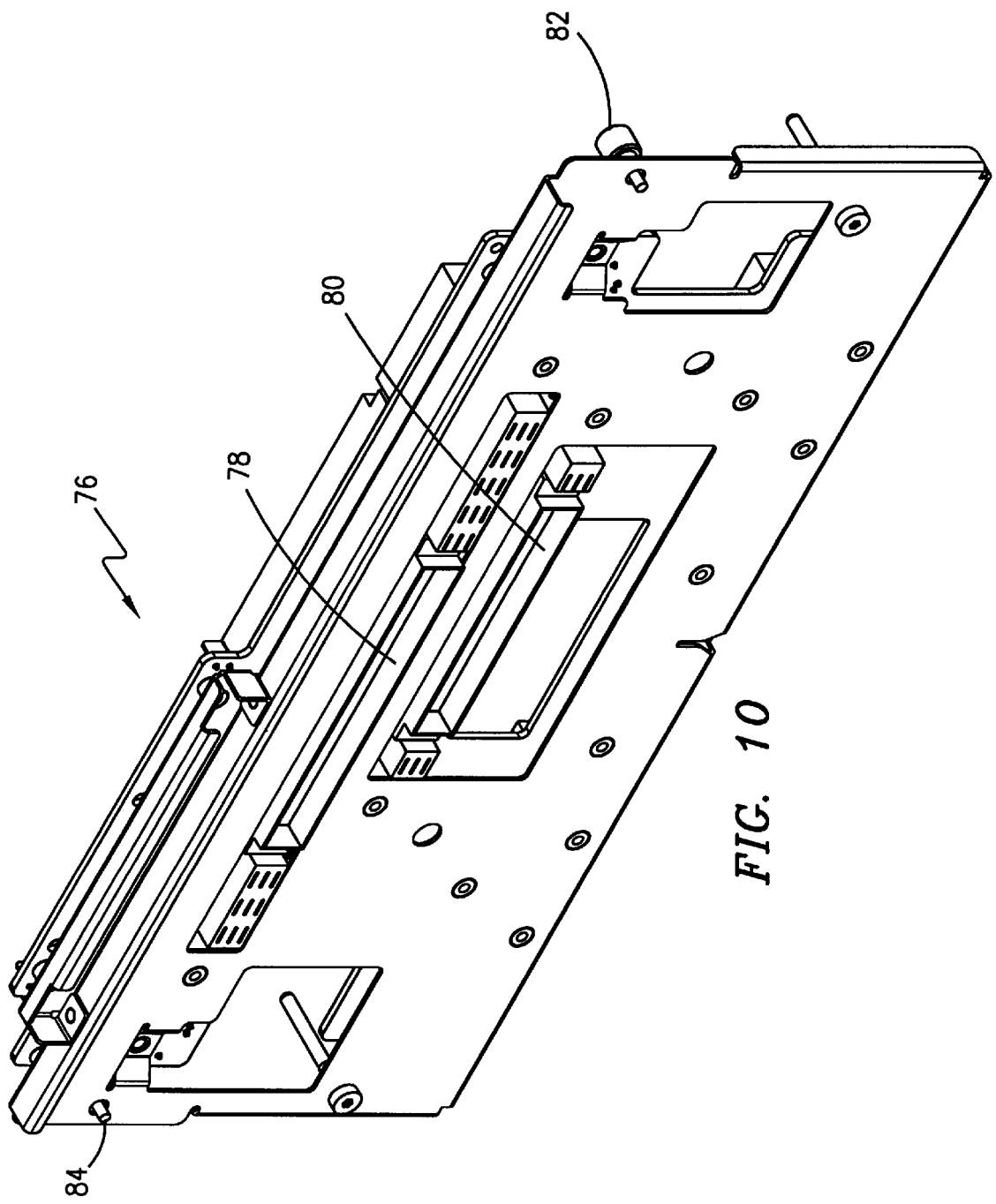
FIG. 10 is a perspective view of a system mid-plane board in accordance with the principles of the present invention as similarly shown in FIG. 9.

Referring now to FIG. 8, there is illustrated a rear perspective view of the I/O module 36. 10 module 36 includes an I/O module connector 74 which is utilized to interface the components of I/O module 36 with the components of the other modules of chassis 10 as well as to provide power from power supplies 34. I/O module 36 further includes display lights 77 which are piped from the error lights 75 from midplane board 76.

Referring now to FIGS. 9–12, there is illustrated an exemplary embodiment of a midplane board 76 utilized in the present invention. Midplane board 76 provides the interface between all of the modules and power supplies within chassis 10. Referring in particular FIGS. 9 and 10 there are illustrated front and front perspective (respectively) views of the midplane board 76. As depicted midplane board 76 includes connectors 78 and 80, and mounting screws 82 and 84. Midplane board 76 is inserted into chassis 10 and secured to center support 44 with mounting screws 82 and 84 which are securable by hand, thereby eliminating any need for tools for the installation and removal therefrom. Connector 78 is in alignment with and receives processor module connector 68 when processor module 16 is inserted into chassis 10. This permits processor module 16 to be plugged directly into midplane board 76. Connector 80 is in alignment with and receives media drive connector 70 when media drive module 18 is inserted into chassis 10. This permits media drive module 18 to be plugged directly into midplane board 76.

Figure 11:
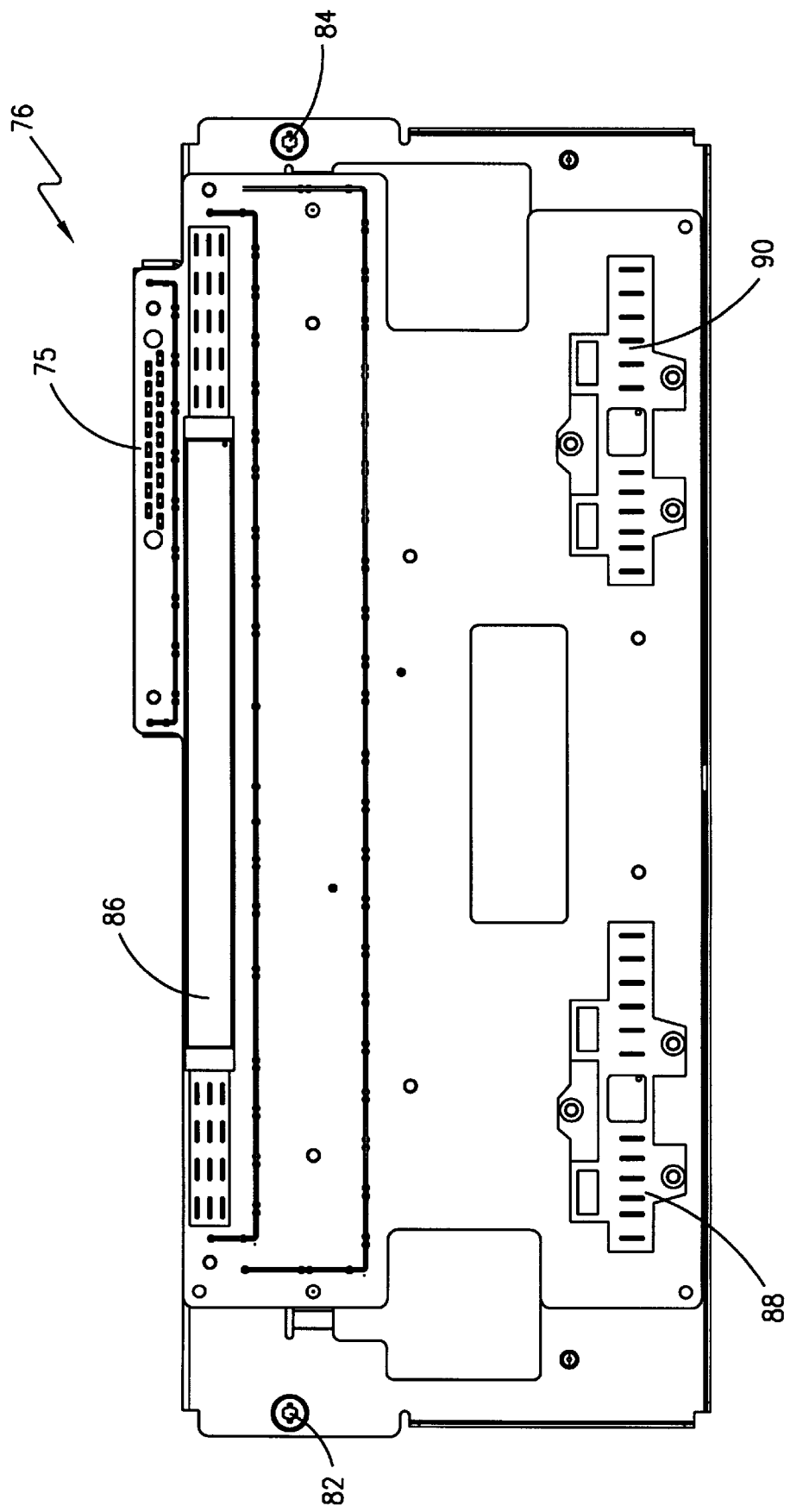
FIG. 11 is a planar rear view of a system mid-plane board in accordance with the principles of the present invention.
Figure 12:
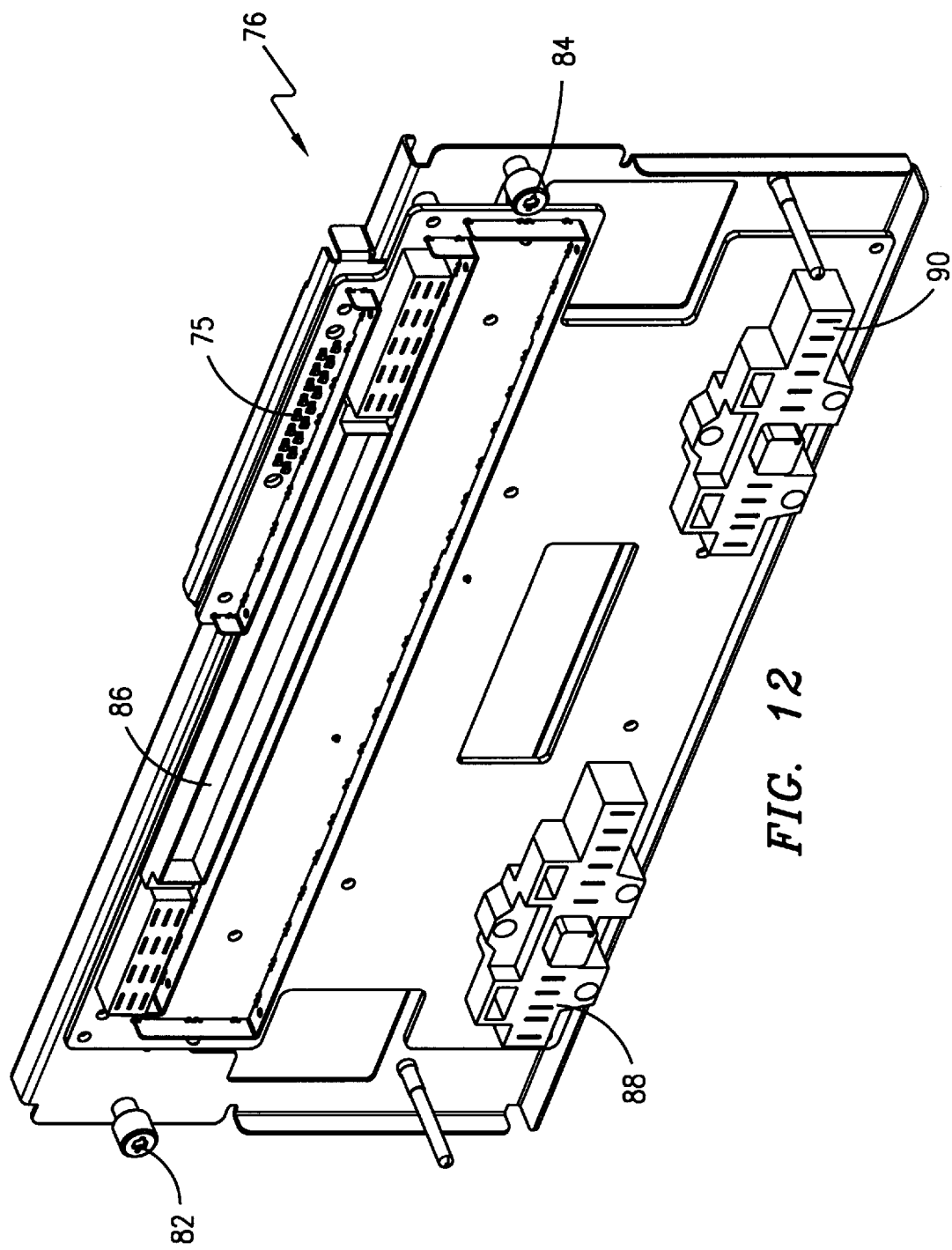
FIG. 12 is a perspective view of a system mid-plane board in accordance with the principles of the present invention; as similarly shown in FIG. 11.

Referring now to FIGS. 11 and 12 there are illustrated rear and rear perspective (respectively) views of the midplane board 76. As depicted midplane board 76 includes error lights 75 and connectors 86, 88 and 90. As described above, midplane board 76 is inserted into chassis 10 and secured to center support 44 with mounting screws 82 and 84. Connector 86 is in alignment with and receives I/O module connector 74 when I/O module 36 is inserted into chassis 10. This permits the I/O module 36 to plug directly into midplane board 76. Connector 88 and 90 are in alignment with and receive power supply connectors 72 when power supplies 34 are inserted into chassis 10. This permits power supplies 34 to plug directly into midplane board 76.

Midplane board 76 is used to directly interconnect all of the modules and their associated components and the power supplies with direct connectors and without any ribbon signal and power cables. The direct connectors facilitate easy assembly and disassembly of the modules from chassis 10, and further permit easy hot-swappability of the power supplies. By not utilizing any ribbon signal and power cables to interconnect the modules and power supplies, a small form factor can be maintained for chassis 10, thereby saving valuable rack mounting space of the chassis 10. By also allowing for easy assembly and disassembly of the modules, the amount of down time for the computer is minimized for repair and/or upgrades of the modules.

Still referring to FIGS. 11 and 12, error lights 75 are utilized to display status and critical error information relating not only to the midplane board 76 but to the computer system as well. For example, error lights 75 are used to indicate whether the power supplies and the other modules are properly inserted into the computer system 10, and further indicate the operating mode of computer system 10. Error lights 75 are piped to the display lights 77 (see FIG. 8) to facilitate user interface.

Therefore, as can be appreciated by one of ordinary skill in the art, the above described invention provides a modularized computer chassis for housing multiple computer modules, such as a processor module, media storage module, an I/O module, and power supplies. The chassis includes a housing divided generally into four regions, with each region configured for receiving either one of the modules or power supplies. A single center pluggable midplane board is positioned in the middle of the housing such that each of the modules and power supplies can be interconnected through the single midplane board. The single center pluggable midplane board includes direct pluggable connectors which correspond to connectors on each of the modules and power supplies, such that each of the modules and power supplies are directly connected to the single pluggable midplane board, and no ribbon signals and power cables needed for the connection. The direct connection between the single center pluggable midplane board and the modules and power supplies helps to minimize the height of the chassis, thereby saving valuable rack space.

Although a preferred embodiment of the apparatus of the present invention has been illustrated in the accompanying Drawings and described in the foregoing Detailed Description, it will be understood that the invention is not limited to the embodiment disclosed, but is capable of numerous rearrangements, modifications and substitutions without departing form the spirit of the invention as set forth and defined by the following claims.

What is claimed is:

1. A computer chassis for housing a plurality of electrical components, comprising:

a first electrical component, having a processor;

a second electrical component;

a housing having a first region and a second region, said first region for receiving therein the first electrical component, and the second region for receiving therein the second electrical component; and an interface positioned intermediate said first region and said second region, said interface for transfer of data between the processor in the first electrical component and the second electrical component when the first electrical component is received in said first region and when the second electrical component is received in said second region, the interface having:

a first connector connected to said interface, said first connector for directly connecting the interface to the first electrical component when received in said first region; and a second connector connected to said interface, said second connector for directly connecting the interface to the second electrical component when received in said second region.

2. The computer chassis of claim 1, wherein the interface includes only one circuit board.

3. The computer chassis of claim 1, wherein the interface is generally planar having a first side and a second side, said first connector being connected to said first side of said interface generally opposite the second connector.

4. The computer chassis of claim 1, further comprising:

a third connector connected to said interface, said third connector for directly connecting the interface to a third electrical component, the third electrical component being received in a third region of the housing oriented vertically in relation to the first region.

5. The computer chassis of claim 1, wherein said interface is removably connected within said housing.

6. The computer chassis of claim 4, wherein said interface is configured to transmit data from the processor to the third electrical component when connected with said third connector.

7. The computer chassis of claim 4, wherein said housing further includes a divider, the divider dividing said housing into a top tier and a bottom tier, the bottom tier for receiving the second electrical component and the top tier for receiving the third electrical component.

8. The computer chassis of claim 5, wherein said interface is configured to be installed and removable without tools.

9. A computer system comprising;

a processor module, including a processor;

a memory module:

a power supply module;

a chassis for housing the processor module, memory module, and power supply module; and an interface for directly coupling the processor module to the memory module, and the power supply module to the processor module and memory module.

10. The computer system of claim 9, wherein said first electrical component includes a plurality of processors and a plurality of memory devices.

11. The computer chassis of claim 9, wherein the said interface is generally planar having a first side and a second side, with a first connector and a second connector being connected to said first side and a third connector being connected to the second side, wherein the processor module is directly connected to the first connector, the memory module is directly connected to the second connector, and the power supply module is directly connected to the third connector.

12. The computer system of claim 9, further comprising:

a fourth electrical component; and a fourth connector connected to the interface, the fourth connector for directly connecting with said fourth electrical component.

13. The computer system of claim 9, wherein said second connector is a multi-pin connector.

14. The computer system of claim 9, wherein said interface is removably connected to said chassis, said interface being removable without tools.

15. The computer system of claim 11, wherein the first connector, second connector and third connector are coupled to a single circuit board within the interface.

16. The computer system of claim 12, wherein the chassis further includes a divider, said divider for dividing said chassis into a top tier and a bottom tier, said bottom tier for receiving said memory module and said top tier for receiving said processor module.

17. A computer, comprising:

a first computer component;

a second computer component;

a third computer component, disposed vertically in relation to the first computer component;

a housing having a front region and a rear region, the front region for housing the first computer component and the third computer component and the rear region for housing the second computer component;

an interface for interfacing the first computer component, the second computer component and the third computer component, the interface positioned intermediate to the front region and the rear region of the housing and having:

a first connector for electrically coupling the first computer component to the interface;

a second connector for electrically coupling the second computer component to the interface, the second connector generally directed towards the rear region of the housing; and a third connector for electrically coupling the third computer component to the interface.

18. The computer chassis of claim 17, wherein the first computer component includes a processor.

19. The computer chassis of claim 17, wherein the third computer component includes computer memory.

20. A computer system, comprising:

a chassis;

a first module disposed in a first region of the chassis;

a second module disposed in the first region of the chassis, the second module being disposed vertically in relation to the first module;

a third module disposed in a second region of the chassis; and an interface for electrically coupling data and power between the first module, the second module, and the third module, the interface being disposed intermediate the first region and the second region, wherein the interface, the first, second, and third modules have electrical connectors for direct electrical coupling of the first, second and third modules to the interface.

* * * * *